United States Patent
Uchida et al.

(10) Patent No.: US 9,991,675 B2
(45) Date of Patent: Jun. 5, 2018

(54) SURFACE EMITTING LASER, LASER ARRAY, LIGHT SOURCE DEVICE, INFORMATION ACQUISITION DEVICE, AND OPTICAL COHERENCE TOMOGRAPHY APPARATUS

(71) Applicant: CANON KABUSHIKI KAISHA, Tokyo (JP)

(72) Inventors: Tatsuro Uchida, Machida (JP); Mamoru Uchida, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days. days.

(21) Appl. No.: 15/310,400

(22) PCT Filed: Apr. 24, 2015

(86) PCT No.: PCT/JP2015/002232
§ 371 (c)(1),
(2) Date: Nov. 10, 2016

(87) PCT Pub. No.: WO2015/174029
PCT Pub. Date: Nov. 19, 2015

(65) Prior Publication Data
US 2017/0149212 A1     May 25, 2017

(30) Foreign Application Priority Data

May 12, 2014  (JP) .................................. 2014-098988
Apr. 13, 2015  (JP) .................................. 2015-082092

(51) Int. Cl.
*H01S 5/18*     (2006.01)
*H01S 5/183*    (2006.01)
(Continued)

(52) U.S. Cl.
CPC ...... *H01S 5/18311* (2013.01); *G01B 9/02091* (2013.01); *H01S 5/02284* (2013.01);
(Continued)

(58) Field of Classification Search
None
See application file for complete search history.

(56) References Cited

U.S. PATENT DOCUMENTS

2014/0268169 A1* 9/2014 Jayaraman .......... H01S 5/18366
356/479

FOREIGN PATENT DOCUMENTS

JP     2002-500446 A     1/2002
JP     2002-319740 A     10/2002
(Continued)

OTHER PUBLICATIONS

Vakhshoori, D., et al., "2mW CW singlemode operation of a tunable 1550nm vertical cavity surface emitting laser with 50nm tuning range", Electronics Letters, May 27, 1999, vol. 35, No. 11.
(Continued)

*Primary Examiner* — Armando Rodriguez
(74) *Attorney, Agent, or Firm* — Canon USA Inc., IP Division (57) ABSTRACT

Provided is a surface emitting laser that is to be excited by an external light source and in which a light-emitting position is defined.
A surface emitting laser includes a pair of reflecting mirrors (11, 15) and an active layer (13) that is arranged between the pair of reflecting mirrors (11, 15) and that is to be excited by light that is radiated from an external light source. A gap is formed between the active layer and one of the pair of reflecting mirrors (15), the oscillation wavelength of the surface emitting laser is changed, and a defining structure (20) that defines a light-emitting region of the active layer (13) is arranged in at least one of a region between the pair of reflecting mirrors (11, 15) and a region in at least one of the pair of reflecting mirrors (11, 15).

17 Claims, 4 Drawing Sheets (51) Int. Cl.
    H01S 5/04    (2006.01)
    H01S 5/42    (2006.01)
    G01B 9/02    (2006.01)
    H01S 5/022   (2006.01)
(52) U.S. Cl.
    CPC .......... *H01S 5/041* (2013.01); *H01S 5/18325* (2013.01); *H01S 5/18358* (2013.01); *H01S 5/18361* (2013.01); *H01S 5/18386* (2013.01); *H01S 5/423* (2013.01)

(56) References Cited

FOREIGN PATENT DOCUMENTS

| JP | 2005-223111 A | 8/2005 |
| JP | 2006-261150 A | 9/2006 |
| WO | 02/075263 A1 | 9/2002 |

OTHER PUBLICATIONS

Jayaraman, V. et al., "Design and performance of broadly tunable, narrow line-width, high repetition rate 1310nm VCSELs for swept source optical coherence tomography", Vertical-Cavity Surface-Emitting Lasers XVI, Proc. of SPIE, 2012, pp. 82760D-2-82760D-4, vol. 8276, No. 1.

Strassner, M. et al., "1.55 μm VCSELs with InP/air-gap distributed bragg reflectors", 2004 International Conference on Indium Phoshide and Related Materials, 16th IPRM, May 31-Jun. 4, 2004, pp. 700-703.

Shin, J.H. et al., "Very Small Oxide-Confined Vertical Microcativity Lasers with High-Contrast AlGaAs-AlxOy Mirrors", IEEE Photonics Technology Letters, Jun. 1998, pp. 754-756, vol. 10, No. 6.

* cited by examiner

SURFACE EMITTING LASER, LASER ARRAY, LIGHT SOURCE DEVICE, INFORMATION ACQUISITION DEVICE, AND OPTICAL COHERENCE TOMOGRAPHY APPARATUS

TECHNICAL FIELD

The present invention relates to a surface emitting laser, a laser array, a light source device, an information acquisition device, and an optical coherence tomography apparatus, the laser array, the light source device, the information acquisition device, and the optical coherence tomography apparatus each including the surface emitting laser.

BACKGROUND ART

It is anticipated that a wavelength-tunable laser that can change an oscillation wavelength will be applied in various fields, such as communications, sensing, imaging, and thus, research and development has been actively conducted in recent years. A so-called MEMS-VCSEL that controls an oscillation wavelength of a vertical cavity surface emitting laser (hereinafter referred to as VCSEL) by using microelectromechanical systems (hereinafter referred to as MEMS) technology is a known example of such a wavelength-tunable laser. Specifically, in a MEMS-VCSEL, cavity length is changed by mechanically moving one of a pair of reflecting mirrors in such a manner as to change laser oscillation wavelength. A MEMS-VCSEL that causes an active layer to be excited by using an external light source is disclosed in NPL 1.

Such a wavelength-tunable laser has attracted attention as a light source of an optical coherence tomography (hereinafter referred to as OCT) apparatus, which is an example of a tomographic imaging apparatus. In an OCT apparatus, a wavelength (oscillation frequency) is changed (swept), and Fourier transform is performed on an interference light detection signal, so that the intensity distribution of reflected light in the depth direction of a specimen is obtained. When the wavelength is swept, light emitted from a light source needs to be coupled to a fiber that forms part of the OCT apparatus.

CITATION LIST

Non Patent Literature

NPL 1 D. Vakhshoori et al., "2 mW CW singlemode operation of a tunable 1550 nm vertical cavity surface emitting laser with 50 nm tuning range", ELECTRONICS LETTERS 27 May 1999 Vol. 35 No. 11 pp. 900-901

SUMMARY OF INVENTION

Technical Problem

In a MEMS-VCSEL, such as that disclosed in NPL 1, that uses external excitation light as a unit configured to cause an active layer to be excited, a light-emitting region in the active layer in an in-plane direction is not defined. Accordingly, variations in the light-emitting region in the in-plane direction of the active layer occur, and it becomes difficult to position the light-emitting region relative to a fiber.

The present invention has been made in view of the above-described problem, and the present invention provides a surface emitting laser that is to be excited by an external light source and in which a light-emitting region is defined.

Solution to Problem

A surface emitting laser according to the present invention includes a pair of reflecting mirrors and an active layer that is arranged between the pair of reflecting mirrors and that is to be excited by light radiated from an external light source. A gap is formed between the active layer and one of the pair of reflecting mirrors, an oscillation wavelength of the surface emitting laser is changed, and a defining structure that defines a light-emitting region of the active layer is arranged in at least one of a region between the pair of reflecting mirrors and a region in at least one of the pair of reflecting mirrors.

Further features of the present invention will become apparent from the following description of exemplary embodiments with reference to the attached drawings.

Advantageous Effects of Invention

According to the present invention, a surface emitting laser that is to be excited by an external light source and in which a light-emitting region is defined can be provided.

DESCRIPTION OF EMBODIMENTS

A wavelength-tunable surface emitting laser, a light source device, an information acquisition device, and an imaging apparatus according to the present invention, the wavelength-tunable surface emitting laser being configured to be excited by an external light source, and the light source device, the information acquisition device, and the imaging apparatus each including the wavelength-tunable surface emitting laser, will be described below. Note that the term "the distance between a pair of reflecting mirrors is changed" refers to the case where "the distance between a pair of reflecting mirrors is changed when a surface emitting laser emits light". More specifically, the distance between a pair of reflecting mirrors is changed as a result of at least one of the pair of reflecting mirrors moving in the thickness direction of an active layer, which forms part of a surface emitting laser.

First Embodiment

Figure 1A:
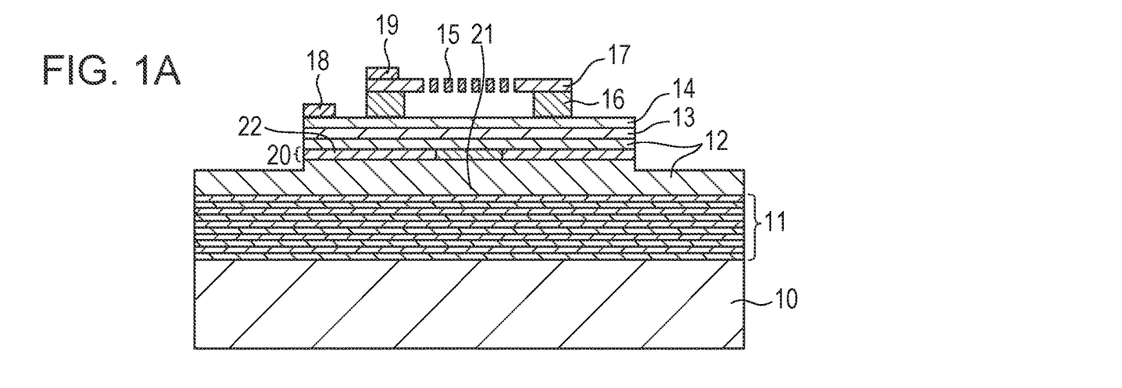
FIG. 1A is a sectional schematic diagram illustrating an example of a surface emitting laser according to a first embodiment.

FIG. 1A is a sectional schematic diagram illustrating a surface emitting laser according to a first embodiment. The surface emitting laser includes a substrate 10, a first reflecting mirror 11, a first spacer layer 12, an active layer 13, a second spacer layer 14, and a second reflecting mirror 15, and the first reflecting mirror 11, the first spacer layer 12, the active layer 13, the second spacer layer 14, and the second reflecting mirror 15 are arranged on the substrate 10. The second reflecting mirror 15 and the second spacer layer 14 are separated by a sacrificial layer (support layer) 16. A gap portion is formed between the second reflecting mirror 15 and the second spacer layer 14 by removing a portion of the sacrificial layer 16. The gap portion is formed between the active layer 13 and the second reflecting mirror 15 that is one of the pair of reflecting mirrors. The second reflecting mirror 15 is supported by a beam 17 that is formed on the sacrificial layer 16.

The active layer 13 of the surface emitting laser emits light by being excited by an external light source 1000, and the emitted light reciprocates in a cavity that is formed of the first reflecting mirror 11 and the second reflecting mirror 15 in such a manner as to cause stimulated emission in the active layer 13. Light of a specific wavelength, which corresponds to the cavity length of the cavity, emitted through the stimulated emission passes through the first reflecting mirror 11 or the second reflecting mirror 15 and is emitted as a laser beam.

The second reflecting mirror 15 and the beam 17 have conductivity. A voltage is applied between a first electrode 18, which is arranged on the second spacer layer 14, and a second electrode 19, which is arranged on the beam 17, so that the second reflecting mirror 15 is MEMS-driven and moves in the thickness direction of the active layer 13. With this configuration, the distance between the first reflecting mirror 11 and the second reflecting mirror 15, that is, the cavity length can be changed, and consequently, the oscillation wavelength of the surface emitting laser can be changed.

In the surface emitting laser according to the present embodiment, a defining structure 20 that defines a light-emitting region of the active layer 13 is arranged in the first spacer layer 12. With this configuration, in the surface emitting laser, variations in the light-emitting region in the in-plane direction of the active layer 13 can be reduced.

A layer that has a first region 21 corresponding to the light-emitting region of the active layer 13 and a second region 22 corresponding to a region other than the light-emitting region of the active layer 13 and in which the refractive index of the first region 21 is larger than the refractive index of the second region 22 can be used as the defining structure 20. With this configuration, the light-emitting region is defined by the light confinement effect due to the refractive index difference. As a result, the laser beam emitted from the surface emitting laser and a fiber can easily be coupled to each other, and the coupling efficiency can be improved.

More specifically, the defining structure 20 can be formed by selectively oxidizing a semiconductor layer arranged between the pair of reflecting mirrors (first reflecting mirror 11 and second reflecting mirror 15). In other words, only the second region 22 of the semiconductor layer that is arranged in the first spacer layer 12 so as to be a base material of the defining structure 20 is oxidized by causing steam oxidation to occur under appropriate conditions starting from a side surface of a mesa structure, which is illustrated in FIG. 1A, so that the above-described defining structure 20 can be formed. As a result, the defining structure 20 becomes a layer in which regions excluding the region that corresponds to the light-emitting region are oxidized, and the first region 21 and the second region 22 become a non-oxidized region and an oxidized region, respectively. For example, when oxidation starts from a side surface of a mesa structure having a columnar shape, a non-oxidized region (first region 21) having a circular shape is formed, and when oxidation starts from a side surface of a mesa structure having an elliptical shape, a non-oxidized region (first region 21) having an elliptical shape is formed. A surface emitting laser that has a non-oxidized region formed in an elliptical shape can be controlled in such a manner as to oscillate in a specific polarization.

The defining structure 20 may be positioned in the first spacer layer 12 or may be positioned in the second spacer layer 14. The defining structure 20 may be positioned both in the first spacer layer 12 and the second spacer layer 14, as shown in FIG. 1D. In addition, the defining structure 20 may be or may not be positioned in the vicinity of the active layer 13. In the case where the defining structure 20 is positioned in the vicinity of the active layer 13, the defining structure 20 may be arranged at the position of a node of a standing wave in the cavity.

The size of the second region 22 of the defining structure 20 is determined in accordance with the oscillation wavelength band of the surface emitting laser and the center wavelength of the oscillation wavelength band. For example, in the case where the center wavelength is 1,040 nm or larger and 1,080 nm or smaller, and the wavelength band is plus-minus 50 nm, the largest diameter of the second region 22 of the defining structure 20 may be 1 micrometer or larger and 5 micrometers or smaller. Note that the wavelength band is determined by the material out of which the active layer 13 is made, a reflection band of the first reflecting mirror 11, a reflection band of the second reflecting mirror 15, and a movable width of the second reflecting mirror 15 in the thickness direction.

The central axis of the defining structure 20 is parallel to the thickness direction of the surface emitting laser and passes through the center of gravity of the first region 21 or the center of gravity of the second region 22. The central axis of the defining structure 20 may coincide with the central axis of excitation light that is emitted from the external light source for exciting the active layer 13. The central axis of the defining structure 20 and the central axis of the excitation light may be parallel to each other.

Although the case where the surface emitting laser includes one defining structure 20 is illustrated in FIG. 1A, the surface emitting laser may include a plurality of defining structures 20 in the thickness direction of the surface emitting laser, as illustrated in FIG. 1D. The plurality of defining structures 20 may be formed between the pair of reflecting mirrors, or some of the plurality of defining structures 20 may be formed in at least one of the pair of reflecting mirrors as in a second embodiment 2, which will be described later. Note that in the case where the surface emitting laser has the configuration in which the surface emitting laser includes a plurality of defining structures 20, the central axes of the plurality of defining structures 20 may coincide with one another.

Figure 4:
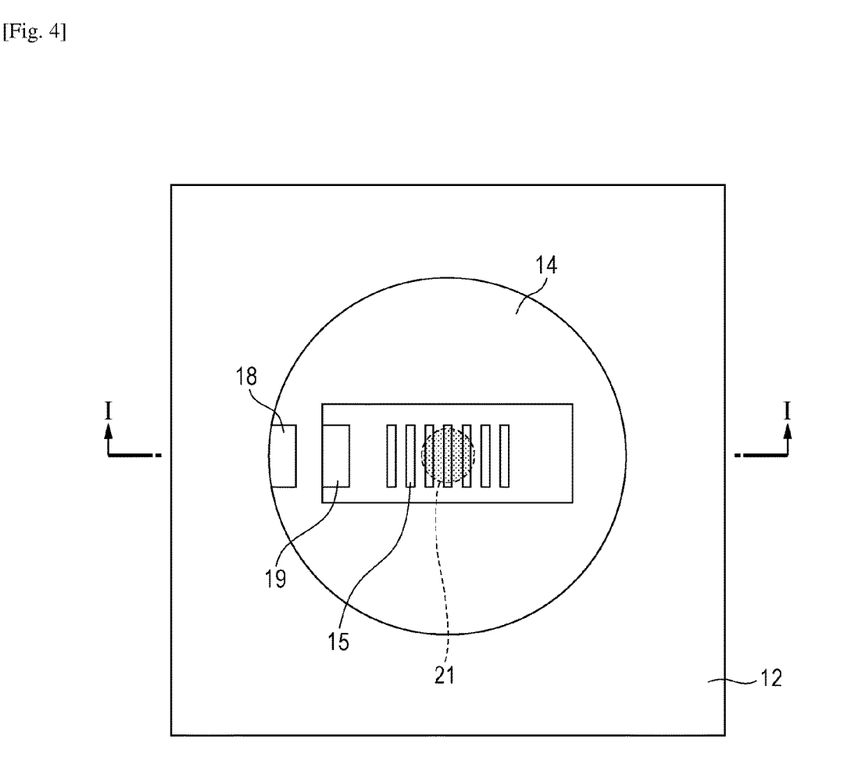
FIG. 4 is a schematic top view illustrating an example of the surface emitting laser according to the first embodiment.

FIG. 4 is a schematic top view illustrating the surface emitting laser illustrated in FIG. 1A. A sectional view taken along line I-I of FIG. 4 corresponds to FIG. 1A. In FIG. 4, the first region 21 in the defining structure 20 is represented by a shaded region. As illustrated in FIG. 4, the size of the first region 21, which corresponds to the light-emitting region, is smaller than the size of the second reflecting mirror 15, which is an output mirror. Note that, although the first electrode 18 is arranged on a portion of the outer periphery of the second spacer layer 14, the first electrode 18 may be arranged over the entire outer periphery of the second spacer layer 14. Alternatively, a plurality of the first electrodes 18 may be arranged on the second spacer layer 14. Similarly, a plurality of the second electrodes 19 may be arranged in a region on the second reflecting mirror 15, the region corresponding to the sacrificial layer 16.

A semiconductor substrate made of GaAs, GaN, or the like can be used as the substrate 10. The materials out of which the first reflecting mirror 11, the first spacer layer 12, the active layer 13, the second spacer layer 14, and the second reflecting mirror 15 are made may be suitably selected depending on the oscillation wavelength band.

A multilayer film such as that illustrated in FIG. 1A can be used as the first reflecting mirror 11. More specifically, a distributed Bragg reflector (hereinafter referred to as DBR) can be used. The DBR has a configuration in which high-refractive-index layers each having a relatively high refractive index and low-refractive-index layers each having a relatively low refractive index are alternately stacked on top of one another. The high-refractive-index layers and the low-refractive-index layers are each formed of a semiconductor layer containing at least one of elements of Al, Ga, In, N, P, and the like. However, the at least one element contained in each of the high-refractive-index layers is different from the at least one element contained in each of the low-refractive-index layers and has a composition ratio different from that of the at least one element contained in each of the low-refractive-index layers. In addition, the optical thickness of each of the high-refractive-index layers and the optical thickness of each of the low-refractive-index layers may be an odd multiple of lambda/4 when the center wavelength is lambda.

The DBR may be formed of a semiconductor multilayer film or may be formed of a dielectric multilayer film. Alternatively, the DBR may be formed of a multilayer body in which semiconductor layers and insulating layers are alternately stacked on top of one another. More specifically, the DBR can have a configuration in which oxide layers obtained by oxidizing a plurality of semiconductor layers, which form part of the reflecting mirror, serve as low-refractive-index layers of the multilayer film reflection mirror. With this configuration, the refractive index difference between the low-refractive-index layers and the high-refractive-index layers can be larger than that of a multilayer film reflection mirror that is formed of only semiconductor layers, and thus, the number of repetitions of alternately stacking the high-refractive-index layers and the low-refractive-index layers on top of one another for obtaining the same reflectance can be reduced compared with the multilayer film reflection mirror, which is formed of only semiconductor layers. In addition, a wavelength bandwidth in which a high reflectance can be obtained can be increased. Thus, a reflecting mirror having a performance equal to or larger than that of the multilayer film reflection mirror, which is formed of only semiconductor layers, can be obtained at lower manufacturing cost than the multilayer film reflection mirror, which is formed of only semiconductor layers. For example, by causing steam oxidation to occur under appropriate conditions in a semiconductor-multilayer-film-reflection mirror that is formed by alternately stacking GaAs layers (high-refractive-index layers) and AlAs layers (low-refractive-index layers) on top of one another, the above-described multilayer film reflection mirror can be obtained. In other words, only oxidation of the AlAs layers is selectively advanced, and the AlAs is changed to aluminum oxide, so that the multilayer film reflection mirror that is formed of semiconductor (GaAs) layers and oxide (aluminum oxide) layers is formed.

The first reflecting mirror 11 need not be the DBR. For example, the first reflecting mirror 11 may be a diffraction grating, which is, for example, a high index contrast grating (hereinafter referred to as HCG) mirror. The HCG mirror has a configuration in which a material having a high refractive index and a material having a low refractive index are alternately and periodically arranged in the in-plane direction. For example, slits (openings) are periodically formed by removing part of the material having a high refractive index (e.g., $Al_{0.7}Ga_{0.3}As$), so that a configuration in which high-refractive-index regions ($Al_{0.7}Ga_{0.3}As$) and low-refractive-index regions (air) are alternately and periodically arranged in the in-plane direction can be obtained. In the case where an HCG mirror is used as the first reflecting mirror 11, an HCG mirror having a one- or two-dimensional periodic structure can be used.

The HCG mirror illustrated in FIG. 1A can be used as the second reflecting mirror 15. More specifically, the second reflecting mirror 15 is a periodic structure that has high-refractive-index regions and low-refractive-index regions (openings: air) and in which periodic openings are formed in the in-plane direction of the second reflecting mirror 15 by processing semiconductor layers. For example, slits are periodically formed by removing part of a material having a high refractive index (e.g., $Al_{0.7}Ga_{0.3}As$), so that a configuration in which high-refractive-index regions ($Al_{0.7}Ga_{0.3}As$) and low-refractive-index regions (air) are alternately and periodically arranged in the in-plane direction can be obtained. In the case where an HCG mirror is used as the second reflecting mirror 15, an HCG mirror having a one-dimensional periodic structure may be used. As illustrated in FIG. 1A, a doubly supported beam may be used as the beam 17, which supports the second reflecting mirror 15, or a cantilever beam may be used as the beam 17.

Figure 1B:
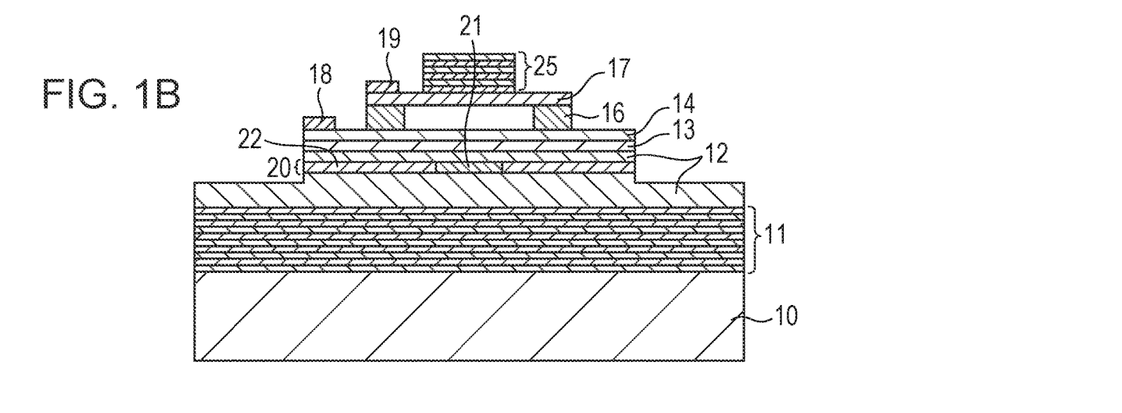
FIG. 1B is a sectional schematic diagram illustrating an example of a surface emitting laser according to a first embodiment.

Instead of an HCG mirror, a DBR 25 illustrated in FIG. 1B can be used as the second reflecting mirror 15. The DBR 25 may be made of the same material as the DBR used as the first reflecting mirror 11. With this configuration, for example, the DBR 25 made of a dielectric material is formed on the beam 17, and the beam 17 is formed of a semiconductor layer. The DBR 25 oscillates together with the beam 17 in the thickness direction in accordance with the voltage applied between the first electrode 18 and the second electrode 19. As illustrated in FIG. 1B, the DBR 25 may be arranged on at least a portion of the beam 17, the portion corresponding to the light-emitting region of the active layer 13 or may be arranged on other portions of the beam 17. Note that the DBR 25 may be made of a semiconductor.

Figure 1C:
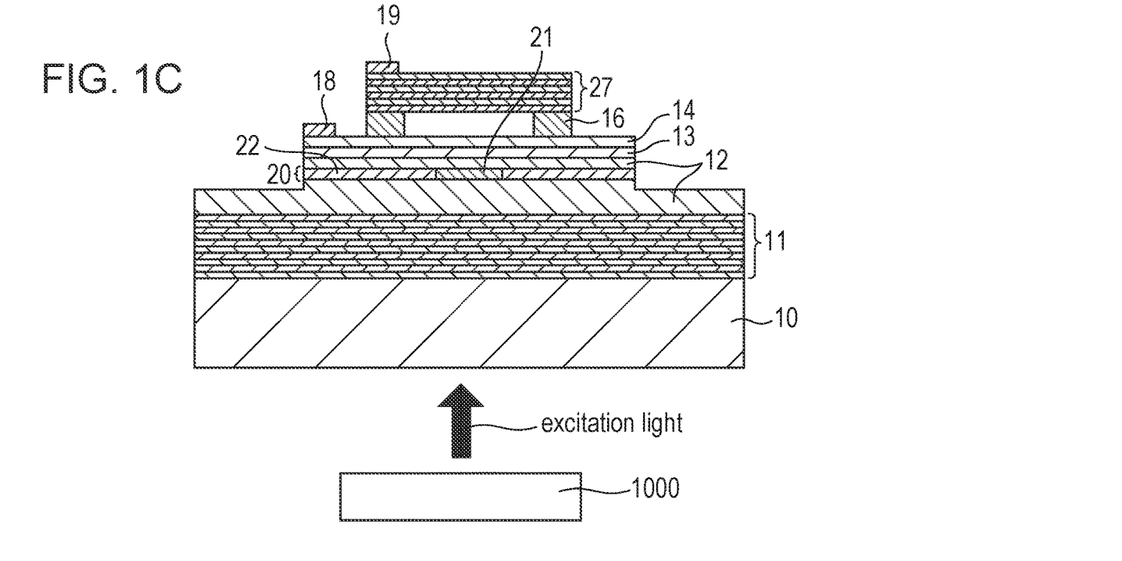
FIG. 1C is a sectional schematic diagram illustrating an example of a surface emitting laser according to a first embodiment.
Figure 1D:
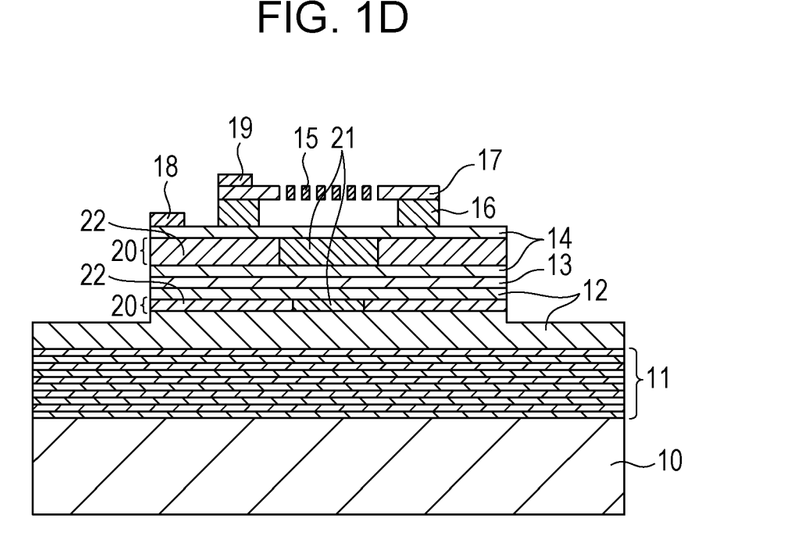
FIG. 1D is a sectional schematic diagram illustrating an example of a surface emitting laser including a plurality of defining structures according to a first embodiment.

As illustrated in FIG. 1C, a DBR 27 that is made of a semiconductor and that also serves as a beam can be used as the second reflecting mirror 15. Also with this configuration, the DBR 27 oscillates in the thickness direction in accordance with the voltage applied between the first electrode 18 and the second electrode 19.

The reflectance of one of the first reflecting mirror 11 and the second reflecting mirror 15 that serves as a reflecting mirror, which extracts light, may be 99.0% or higher and 99.5% or lower. The reflectance of the other one of the first reflecting mirror 11 and the second reflecting mirror 15 that does not serve as the reflecting mirror, which extracts light, may be 99.5% or higher. In FIG. 1A, the second reflecting mirror 15 serves as the reflecting mirror that extracts light. In the case where the first reflecting mirror 11 is set to serve as the reflecting mirror that extracts light, a portion of the substrate 10 that corresponds to the light-emitting region may be removed in order to suppress absorption of the laser beam.

The first spacer layer 12 and the second spacer layer 14 each plays a role of a cladding layer that is used for confining light and carriers and a role to adjust the cavity length. The first spacer layer 12 is a layer positioned between the active layer 13 and the first reflecting mirror 11, and on the other hand, the second spacer layer 14 is a layer positioned between the active layer 13 and the second reflecting mirror 15. The first spacer layer 12 and the second spacer layer 14 can be made of a semiconductor material. The thicknesses of the first spacer layer 12 and the second spacer layer 14 need not be the same as each other and may be suitably set in accordance with the cavity length. The first spacer layer 12 and the second spacer layer 14 is each formed of a semiconductor layer containing at least one of elements of Al, Ga, In, N, P, and the like.

The active layer 13 is not particularly limited as long as it is made of a material that emits light by being excited by the external light source. For example, the active layer 13 is formed of a semiconductor layer containing at least one of elements of Al, Ga, In, N, P, and the like. In addition, the active layer 13 may have a gain in a wide wavelength band, and specifically, may have a sufficient gain in a wavelength region that is wider than the reflection band of the first reflecting mirror 11 and the reflection band of the second reflecting mirror 15. An example of the active layer 13 is an active layer that has a quantum well structure and that can emit light at at least two or more different energy levels. The quantum well structure may be a single quantum well structure or may be a multiple quantum well structure. In the case of the multiple quantum well structure, the active layer 13 may have a plurality of quantum wells each having the same well potential depth and the same well width or may have a plurality of quantum wells having different well potential depths and different well widths.

As described above, the sacrificial layer 16 defines the gap portion, which is formed between the second reflecting mirror 15 and the second spacer layer 14 and which enables the second reflecting mirror 15 to move. The sacrificial layer 16 can be made of a semiconductor material. Note that the gap portion may be in a vacuum state, or an air or an inert gas may be present in the gap portion. Note that the length of the gap portion is set in accordance with a wavelength-tunable bandwidth and is set in such a manner that the second reflecting mirror 15 will not be pulled in.

The beam 17 is made of a semiconductor so as to be bended by an electrostatic force generated by applying a voltage between the first electrode 18 and the second electrode 19. The material of the beam 17 may be the same material as part of members constituting the second reflecting mirror 15.

The first electrode 18 and the second electrode 19 are made of a metal. A voltage is supplied to the first electrode 18 and the second electrode 19 by a control unit (not illustrated).

Each of the semiconductor layers (first spacer layer 12, active layer 13, and second spacer layer 14) that are arranged between the pair of reflecting mirrors 11 and 15 may be formed of a non-doped semiconductor layer that does not contain a dopant or may be formed of a doping semiconductor layer that contains a dopant. In the case where the semiconductor layers are non-doped semiconductor layers, optical absorption loss can be reduced, and a surface emitting laser with high light emitting efficiency can be obtained. In addition, in the case where the pair of reflecting mirrors 11 and 15 contain a semiconductor, when the semiconductor layers, which are the pair of reflecting mirrors 11 and 15, are non-doped semiconductor layers, optical absorption is further suppressed, and a surface emitting laser with higher light emitting efficiency can be obtained.

According to the present invention, since the defining structure 20 is provided, transverse mode control can also be performed. Thus, a semiconductor laser that operates in a multi-transverse mode or a super luminescent diode can be selected as the external light source. Obviously, a semiconductor laser that operates in a single transverse mode can also be used as the external light source.

The external light source 1000 is arranged for the surface emitting laser in such a manner as to radiate the excitation light onto a portion of the defining structure 20 corresponding to the light-emitting region of the active layer 13. In addition, as described above, the external light source 1000 may be arranged in such a manner that the central axis of the excitation light emitted by the external light source 1000 coincides with the central axis of the defining structure 20. The excitation light contains a wavelength component shorter than the shortest wavelength in the oscillation wavelength band of the surface emitting laser.

Although one surface emitting laser has been described in the present embodiment, the present invention can also be applied to a laser array that includes a plurality of surface emitting lasers arranged in an array. Note that, in a plurality of surface emitting lasers, a portion that is positioned further toward the side on which the substrate 10 is present than the mesa structure portion, specifically, the substrate 10 and the first reflecting mirror 11 may be shared.

Second Embodiment

Figure 2:
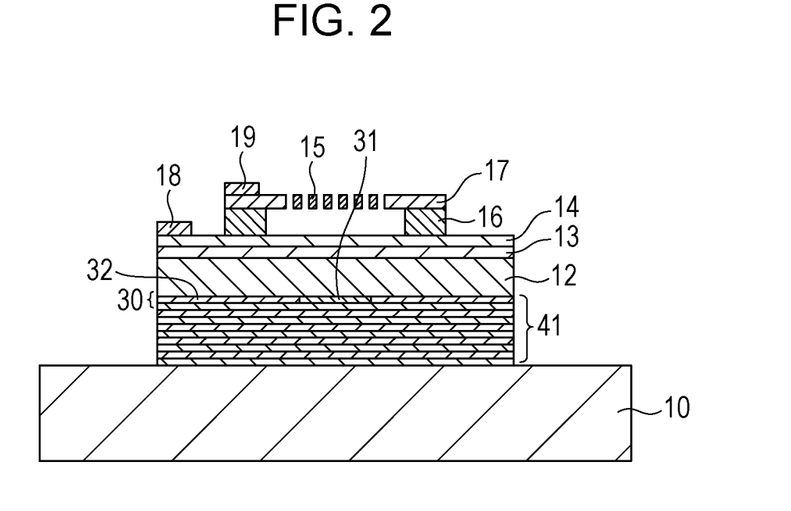
FIG. 2 is a sectional schematic diagram illustrating an example of a surface emitting laser according to a second embodiment.

FIG. 2 is a sectional schematic diagram illustrating a surface emitting laser according to a second embodiment. A difference between the surface emitting laser according to the second embodiment and the surface emitting laser according to the first embodiment is the position at which a defining structure is arranged. More specifically, although the defining structure 20 according to the first embodiment is arranged between the first reflecting mirror 11 and the second reflecting mirror 15, a defining structure 30 according to the second embodiment is formed in a first reflecting mirror 41. In addition, a mesa structure is formed in such a manner that a side surface of the first reflecting mirror 41 is exposed. The rest of the configuration of the surface emitting laser according to the second embodiment is the same as that of the surface emitting laser according to the first embodiment.

Similarly to the defining structure 20 according to the first embodiment, the defining structure 30 has a first region 31 that corresponds to the light-emitting region of the active layer 13 and a second region 32 that corresponds to a region other than the light-emitting region of the active layer 13. In addition, the refractive index of the first region 31 is larger than the refractive index of the second region 32. Thus, the light-emitting region is defined by the light confinement effect due to the refractive index difference.

In order to obtain such a configuration, the following method may be considered. For example, a multilayer body in which low-refractive-index layers formed of oxide layers and high-refractive-index layers formed of semiconductors are alternately stacked on top of one another is used as the first reflecting mirror 41. When the low-refractive-index layers are formed by selective oxidation, progression of the oxidation is controlled by setting the composition of one of (or a plurality of) semiconductor layers that are to be changed to oxide layers to be different from the composition of a different one of the semiconductor layers, which are to be changed to oxide layers, so that the defining structure 30 can be formed in the first reflecting mirror 41. More specifically, first, a multilayer film that serves as a base of the first reflecting mirror 41 is made to include one semiconductor layer (or a plurality of semiconductor layers) having a content of Al that is smaller than a content of Al in each of the semiconductor layers, which will become the low-refractive-index layers, by a percentage within a range of 1% and 8%. Then, the multilayer film is oxidized, and by utilizing the fact that oxidation rate differs depending on the composition of Al, oxidation of the semi-conductor layer whose content of Al is relatively small is retarded. As a result, the semiconductor layer is made to have the first region 31, which is a non-oxidized region, and the second region 32, which is an oxidized region and becomes the above-described defining structure 30.

Although in the first reflecting mirror 41, the layer that serves as the defining structure 30 has a composition different from those of the low-refractive-index layers, some or all of the low-refractive-index layers may each have the same composition as the defining structure 30. In this case, a plurality of the defining structures 30 are formed in the first reflecting mirror 41. In addition, the contents of Al in the low-refractive-index layers need not be the same as one another as long as the relationship between the contents of Al in the low-refractive-index layers and the content of Al in the defining structure 30 satisfies the above-mentioned range.

Among the low-refractive-index layers included in the first reflecting mirror 41, the defining structure 30 is positioned to be closest to the active layer 13. However, the present invention is not limited to this. The defining structure 30 may be positioned so as to be a center portion of the first reflecting mirror 41 or may be positioned so as to be closest to the substrate 10 among the low-refractive-index layers (arranged at a position farthest from the active layer 13).

All of the plurality of low-refractive-index layers of the first reflecting mirror 41 need not be formed of oxide layers. One of the low-refractive-index layers that is close to the active layer 13 may be formed of an oxide layer, and the rest of the low-refractive-index layers that are positioned between the one of the low-refractive-index layers and the substrate 10 need not be oxidized. In this case, the mesa structure may be formed in such a manner that a side surface of the low-refractive-index layer, which is formed of an oxide layer, is exposed.

Among the low-refractive-index layers including the defining structure 30 that are included in the first reflecting mirror 41, at least some of the low-refractive-index layers excluding the low-refractive-index layer that is included in the defining structure 30 may be entirely oxidized. In addition, all of the low-refractive-index layers excluding the low-refractive-index layer that is included in the defining structure 30 may be entirely oxidized. In this configuration, in the first reflecting mirror 41, the refractive index difference between the high-refractive-index layers and the low-refractive-index layers is large. Thus, the reflectance of the first reflecting mirror 41 can be increased, and a reflection wavelength band can be widened.

Although the case where the defining structure 30 is formed in the first reflecting mirror 41 has been described above, in the case where the second reflecting mirror 15 is formed of a DBR, the defining structure 30 may be formed in the second reflecting mirror 15. In the case where the defining structure 30 is formed in the second reflecting mirror 15, the beam 17 may be formed of a doubly supported beam.

Third Embodiment

In a third embodiment, an application of the surface emitting laser according to the first or second embodiment and a light source device that includes an external light source that is used for causing the active layer of the surface emitting laser to be excited will be described. A wavelength-tunable light source device can be used as a light source for optical communication or a light source for optical measurement. The light source device can be used as a light source device of an information acquisition device that acquires internal information of an object to be measured non-invasively and non-destructively. As an example of an information acquisition device that includes the light source device according to the present embodiment, an optical coherence tomography (hereinafter referred to as OCT) apparatus will be described below with reference to FIG. 3.

Figure 3:
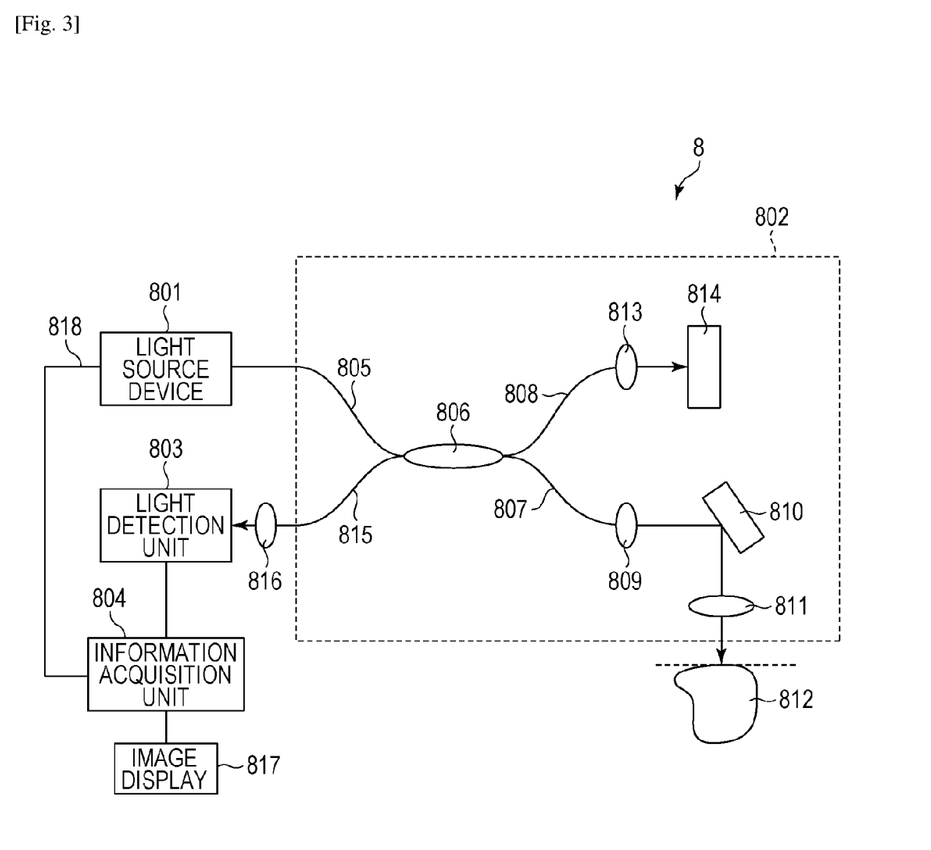
FIG. 3 is a schematic diagram illustrating an imaging apparatus according to a third embodiment.

FIG. 3 is a schematic diagram illustrating an OCT apparatus 8 according to the third embodiment. The OCT apparatus 8 at least includes a light source device 801, an interference optical system 802, a light detection unit 803, and an information acquisition unit 804 that acquires internal information of an object to be measured. The surface emitting laser according to the first or second embodiment can be used as the light source device 801. The information acquisition unit 804 includes a Fourier transform unit (not illustrated). Here, the term "the information acquisition unit 804 includes a Fourier transform unit" does not limit the configuration of the information acquisition unit 804, and the configuration of the information acquisition unit 804 is not particularly limited as long as the information acquisition unit 804 has a function of performing Fourier transform on input data. One example of the configuration of the information acquisition unit 804 is that the information acquisition unit 804 includes an operation unit, and the operation unit has a function of performing Fourier transform. More specifically, the operation unit is a computer that includes a CPU, and the computer executes an application having a Fourier transform function. Another example of the configuration of the information acquisition unit 804 is that the information acquisition unit 804 includes a Fourier transform circuit that has the Fourier transform function.

Light emitted by the light source device 801 passes through the interference optical system 802 and is output as interference light that has information of an object 812 that is to be measured. The interference light is received by the light detection unit 803. Note that the light detection unit 803 may be a differential-detection-type light detection unit or may be a simple intensity-monitor-type light detection unit. Information regarding the time waveform of the intensity of the interference light, which has been received, is sent to the information acquisition unit 804 from the light detection unit 803. The information acquisition unit 804 acquires the peak value of the time waveform of the intensity of the interference light, which has been received, performs Fourier transform, and acquires information of the object 812 (e.g., information of a tomographic image). Note that the light source device 801, the an interference optical system 802, the light detection unit 803, and the information acquisition unit 804, which have been described above, may be arbitrarily provided.

Operation during the period from when light is radiated from the light source device 801 until the information acquisition unit 804 acquires internal information of the object 812, which is to be measured, will be described in detail below. The light emitted by the light source device 801 enters a coupler 806 by passing through the fiber 805 and is separated into irradiated light that passes through a fiber 807 for irradiated light and reference light that passes through a fiber 808 for reference light. The coupler 806 is formed of a coupler that operates in a single mode in the wavelength band of a light source, and these fibers and the coupler may be formed of 3-dB couplers. The irradiated light becomes collimated light by passing through a collimator 809 and is reflected by a mirror 810. The light reflected by the mirror 810 passes through a lens 811, is radiated onto the object 812, and is reflected by each layer of the object 812 in the depth direction of the object 812.

On the other hand, the reference light passes through a collimator 813 and is reflected by a mirror 814. In the coupler 806, interference light formed of reflected light from the object 812 and reflected light from the mirror 814 is generated. The interference light passes a fiber 815, is converged by passing through a collimator 816, and is received by the light detection unit 803. Information regarding the intensity of the interference light, which has been received by the light detection unit 803, is converted into electric information, such as a voltage, and sent to the information acquisition unit 804. The information acquisition unit 804 processes data of the intensity of the interference light, specifically, performs Fourier transform on the data and acquires information of a tomographic image. Although the data of the intensity of the interference light, which undergoes the Fourier transform, is usually data that is sampled at regular wave number intervals, data that is sampled at regular wavelength intervals can be used.

The information of the tomographic image, which has been obtained, may be sent to an image display 817 from the information acquisition unit 804 in such a manner as to be displayed as an image. Note that by scanning the mirror 810 in a plane perpendicular to the direction in which the irradiation light enters, a three-dimensional tomographic image of the object 812, which is to be measured, can be acquired. The light source device 801 may be controlled by the information acquisition unit 804 via an electric circuit 818. Although not illustrated, the intensity of the light emitted by the light source device 801 may be sequentially monitored, and the resulting data may be used for amplitude correction of an interference-light-intensity signal.

In each of the surface emitting lasers according to the first to third embodiments of the present invention, the light-emitting region is defined by the light confinement effect due to a refractive index difference. Thus, in the case where any one of the surface emitting lasers is used in an OCT apparatus, a laser beam emitted from the light source device 801 (surface emitting laser) and the fiber 805 can easily be coupled to each other, the coupling efficiency can be improved, and laser beams over a wide band can be oscillated. Therefore, a tomographic image with high depth resolution can be obtained.

An OCT apparatus is useful for acquiring a tomographic image of the inside of a living organism, such as an animal or a human, in fields, such as ophthalmology, dentistry, and dermatology. Information regarding a tomographic image of a living organism includes not only a tomographic image of the living organism but also numerical data that is required for acquiring the tomographic image. In particular, an OCT apparatus may be used for acquiring information regarding tomographic images of objects to be measured such as eyegrounds, teeth, and blood vessels of human bodies.

EXAMPLES

Examples of the present invention will be described below.

Example 1

A surface emitting laser in Example 1 corresponds to the first embodiment and is illustrated in FIG. 1A. A method of manufacturing the surface emitting laser in Example 1 will be described below. First, the first reflecting mirror 11 that is formed of a semi-conductor multilayer film, which is formed of 60 pairs of $Al_{0.5}Ga_{0.5}As$ layers (high-refractive-index layers) and $Al_{0.9}Ga_{0.1}As$ layers (low-refractive-index layers), the $Al_{0.5}Ga_{0.5}As$ layers and the $Al_{0.9}Ga_{0.1}As$ layers being alternately stacked on top of one another, is grown on an n-type GaAs semiconductor substrate 10 with a buffer layer (not illustrated) interposed between the first reflecting mirror 11 and the n-type GaAs semiconductor substrate 10. This film deposition method uses the MOCVD crystal growing method.

Part of the first spacer layer 12 of $Al_{0.3}Ga_{0.7}As$, an $Al_{0.98}Ga_{0.02}As$ layer, and the other part of the first spacer layer 12 of $Al_{0.3}Ga_{0.7}As$, are grown in this order on the first reflecting mirror 11. Then, the active layer 13 (having a three-quantum well structure including a GaAs layer and an $Al_{0.3}Ga_{0.7}As$ layer) and the second spacer layer 14 of $Al_{0.3}Ga_{0.7}As$ are grown on the first spacer layer 12.

Next, an $Al_{0.7}Ga_{0.3}As$ layer (not illustrated), the sacrificial layer 16 made of GaAs, and $Al_{0.7}Ga_{0.3}As$ layers that will serve as the beam 17 and the second reflecting mirror 15 are formed.

After that, a columnar mesa structure of the surface emitting laser is formed by using a lithography technique and a dry etching technique. In this case, dry etching is performed in such a manner that a side surface of the $Al_{0.98}Ga_{0.02}As$ layer is exposed with certainty. In addition, regions corresponding to the second reflecting mirror 15 and the beam 17 are formed by using the lithography technique and the dry etching technique in such a manner as to cause a portion of an upper portion of the second spacer layer 14 to be exposed. Then, slits are formed in a region, in which the second reflecting mirror 15 is to be formed, by using the lithography technique and the dry etching technique, and the second reflecting mirror 15 that is formed of an HCG mirror is formed.

Next, the $Al_{0.98}Ga_{0.02}As$ layer is selectively oxidized in a water vapor atmosphere, and the defining structure 20 (having the second region 22, which is an oxidized region, and the first region 21, which is a non-oxidized region) is formed.

Then, the first electrode 18 and the second electrode 19 are respectively formed on the portion of the second spacer layer 14 that is exposed and on the beam 17.

Subsequently, part of the sacrificial layer 16 is removed via the slits of the HCG mirror by using a wet etching technique in such a manner as to form a gap portion. A surface emitting laser in which the second reflecting mirror 15 functions as a movable mirror is formed in this manner.

Note that the surface emitting laser can be manufactured by rearranging the order of the above-described processes.

Example 2

A surface emitting laser in Example 2 corresponds to the first embodiment and is illustrated in FIG. 2. A method of manufacturing the surface emitting laser in Example 2 will be described below focusing on differences from Example 1.

One of the differences between Example 2 and Example 1 is that the first reflecting mirror is formed of 9 pairs of $Al_{0.5}Ga_{0.5}As$ layers (high-refractive-index layers) and aluminum oxide layers (low-refractive-index layers), the $Al_{0.5}Ga_{0.5}As$ layers and the aluminum oxide layers being alternately stacked on top of one another. The other one of the differences between Example 2 and Example 1 is that one of the aluminum oxide layer that is an uppermost portion of the first reflecting mirror 41 is the defining structure 30. The rest of the configuration of the surface emitting laser in Example 2 is the same as that of the surface emitting laser in Example 1.

First, 8 pairs of $Al_{0.5}Ga_{0.5}As$ layers and AlAs layers, the $Al_{0.5}Ga_{0.5}As$ layers and AlAs layers being alternately stacked on top of one another, are formed on an n-type GaAs semiconductor substrate 10 by using the MOCVD crystal growing method, and a pair of an $Al_{0.5}Ga_{0.5}As$ layer and an $Al_{0.98}Ga_{0.02}As$ layer stacked one on top of the other is formed on the 8 pairs of $Al_{0.5}Ga_{0.5}As$ layers and AlAs layers.

After that, layers that will serve as the first spacer layer 12, the active layer 13, the second spacer layer 14, an $Al_{0.7}Ga_{0.3}As$ layer (not illustrated), the sacrificial layer 16, the beam 17, and the second reflecting mirror 15 are formed, and subsequent processes same as those in Example 1 are performed in order to form a columnar mesa structure. Note that, unlike Example 1, when the mesa structure is formed, etching is performed in such a manner that the GaAs semiconductor substrate 10 is exposed in Example 2.

After the mesa structure has been formed, the AlAs layers and the $Al_{0.98}Ga_{0.02}As$ layer are oxidized. In this oxidation process, the $Al_{0.98}Ga_{0.02}As$ layer is oxidized at an oxidation rate lower than that at which the AlAs layers are oxidized, and thus, a non-oxidized region (first region 31) is generated in part of the $Al_{0.98}Ga_{0.02}As$ layer in the in-plane direction, so that the defining structure 30 is formed. Note that all of the AlAs layers become aluminum oxide layers in the in-plane direction. In addition, since oxidation of an $Al_{0.98}Ga_{0.02}As$ layer is advanced at a constant rate starts from a side wall of the columnar mesa structure, the non-oxidized region (first region 31) is formed in a center portion of the mesa structure.

Subsequent processes are performed in a similar manner to Example 1, and a surface emitting laser in which the second reflecting mirror 15 functions as a movable mirror is formed.

Note that, in Example 2, the refractive index difference between the high-refractive-index layers and the low-refractive-index layers, which are included in the first reflecting mirror 41, is larger than that in Example 1, and thus, a mirror having a high reflectance can be obtained with a small number of pairs of layers. Accordingly, this manufacturing method is effective for a reduction in the manufacturing costs.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-098988, filed May 12, 2014, and No. 2015-082092, filed Apr. 13, 2015, which are hereby incorporated by reference herein in their entirety.

REFERENCE SIGNS LIST

11, 41 first reflecting mirror
15, 25, 27 second reflecting mirror
20, 30 defining structure

The invention claimed is:
1. A surface emitting laser comprising:
a pair of reflecting mirrors; and
an active layer arranged between the pair of reflecting mirrors,
wherein the active layer is to be excited by excitation light,
wherein a gap is formed between the active layer and one of the pair of reflecting mirrors,
wherein an oscillation wavelength of the surface emitting laser is changed by changing a position of at least one of the pair of reflecting mirrors,
wherein a defining structure that defines a light-emitting region of the active layer is arranged in at least one of a region between the pair of reflecting mirrors and a region in at least one of the pair of reflecting mirrors,
wherein, in the defining structure, a region excluding a region that corresponds to the light-emitting region is oxidized, and
wherein the defining structure is included in at least one of the pair of reflecting mirrors.
2. The surface emitting laser according to claim 1,
wherein the defining structure is arranged between the pair of reflecting mirrors.
3. The surface emitting laser according to claim 2, further comprising:
at least one semiconductor layer between one of the pair of reflecting mirrors and the active layer,
wherein the defining structure is configured so that, in the at least one semiconductor layer, a region excluding a region that corresponds to a light-emitting region is oxidized.
4. The surface emitting laser according to claim 1,
wherein the at least one of the pair of reflecting mirrors, which includes the defining structure, has a multilayer film.
5. The surface emitting laser according to claim 4,
wherein the multilayer film is a semiconductor multilayer film.
6. The surface emitting laser according to claim 4,
wherein the defining structure is configured so that a part of the multilayer film is oxidized and, in the multilayer film oxidized, a region excluding a region that corresponds to the light-emitting region is oxidized.
7. The surface emitting laser according to claim 6,
wherein the at least one of the pair of reflecting mirrors, which includes the defining structure, is formed by alternately stacking high-refractive-index layers each having a relatively high refractive index and low-refractive-index layers each having a relatively low refractive index on top of one another, and
wherein the defining structure is configured so that a part of the low-refractive-index layer is oxidized, and, in the low-refractive-index layer oxidized, a region excluding the region that corresponds to the light-emitting region is oxidized.

8. The surface emitting laser according to claim 7, wherein at least some of the low-refractive-index layers that are included in the at least one of the pair of reflecting mirrors, which includes the defining structure, excluding the low-refractive-index layer that is included in the defining structure, are entirely oxidized.

9. The surface emitting laser according to claim 8, wherein all of the low-refractive-index layers that are included in the at least one of the pair of reflecting mirrors, which includes the defining structure, excluding the low-refractive-index layer that is included in the defining structure, are entirely oxidized.

10. The surface emitting laser according to claim 1, wherein the defining structure is arranged both between the pair of reflecting mirrors and in at least one of the pair of reflecting mirrors.

11. The surface emitting laser according to claim 1, wherein a central axis of the defining structure coincides with a central axis of excitation light.

12. The surface emitting laser according to claim 1, further comprising, in a thickness direction:
a plurality of the defining structures,
wherein at least two of central axes of the plurality of the defining structures coincide with each other.

13. The surface emitting laser according to claim 1, wherein semiconductor layers that are arranged between the pair of reflecting mirrors are each a non-doped semiconductor layer.

14. The surface emitting laser according to claim 1, wherein the pair of reflecting mirrors include semiconductor layers, and
wherein all of the semiconductor layers included in the pair of reflecting mirrors are non-doped semiconductor layers.

15. A light source device comprising:
the surface emitting laser according to claim 1; and
an external light source that is used for causing an active layer to be excited.

16. An information acquisition device comprising:
the light source device according to claim 15; and
an information acquisition unit that acquires internal information of an object to be measured.

17. An optical coherence tomography apparatus comprising:
the light source device according to claim 15;
an interference optical system that causes light emitted by the light source device to be separated into irradiated light, which is radiated onto an object to be measured, and reference light and generates interference light formed of reflected light, which is light radiated on and reflected by the object to be measured, and the reference light;
a light detection unit that receives the interference light; and
an information acquisition unit that acquires information of the object to be measured on the basis of a signal from the light detection unit.

* * * * *